US012812954B2

(12) United States Patent
You et al.

(10) Patent No.: US 12,812,954 B2
(45) Date of Patent: Nov. 24, 2026

(54) SEMICONDUCTOR DEVICE AND METHOD OF FORMING THE SAME

(71) Applicant: HON HAI PRECISION INDUSTRY CO., LTD., New Taipei City (TW)

(72) Inventors: Jheng-Sheng You, New Taipei City (TW); Jhe-Hao Chang, New Taipei City (TW)

(73) Assignee: HON HAI PRECISION INDUSTRY CO., LTD., New Taipei City (TW)

( * ) Notice: Subject to any disclaimer, the term of this patent is extended or adjusted under 35 U.S.C. 154(b) by 335 days.

(21) Appl. No.: 18/653,999

(22) Filed: May 3, 2024

(65) Prior Publication Data

US 2025/0294851 A1 Sep. 18, 2025

(30) Foreign Application Priority Data

Mar. 18, 2024 (TW) ................................ 113109988

(51) Int. Cl.
*H01L 29/76* (2006.01)
*H10D 30/47* (2025.01)
(Continued)

(52) U.S. Cl.
CPC ........... *H10D 64/518* (2025.01); *H10D 30/47* (2025.01); *H10D 64/258* (2025.01); *H10P 30/206* (2026.01); *H10P 30/21* (2026.01)

(58) Field of Classification Search
CPC .... H10D 64/528; H10D 64/258; H10D 30/47; H10D 62/8503; H10D 30/015; H10D 30/475; H10D 62/343; H10D 64/411; H10D 64/257; H10D 62/824; H10D 62/82; H10D 30/4755; H10D 84/83; H10D 12/441; H10D 30/471; H10D 84/00; H10D 30/60; H10D 64/111; H10D 84/0126; H10D 12/00; H10D 84/84; H10D 62/357; H10D 84/0123; H10D 84/0112; H10D 62/393; H10D 62/85; H10D 84/401; H10D 12/031; H10D 30/0291; H10D 30/87; H10P 30/206; H10P 30/21
See application file for complete search history.

(56) References Cited

U.S. PATENT DOCUMENTS

2011/0272740 A1* 11/2011 Umeda ................ H10D 30/015
257/E21.403
2019/0181232 A1* 6/2019 Mizue .................. H10D 30/015
(Continued)

FOREIGN PATENT DOCUMENTS

CN 209675293 U * 11/2019
TW I783254 B 11/2022
(Continued)

*Primary Examiner* — Niki H Nguyen
(74) *Attorney, Agent, or Firm* — CKC & Partners Co., LLC

(57) ABSTRACT

A semiconductor device includes a channel layer disposed on a substrate, a barrier layer disposed on the channel layer, a gate structure disposed on the barrier layer, and a source electrode and a drain electrode disposed on the barrier layer and disposed at opposite sides of the gate structure. The gate structure includes a main portion and a head portion adjacent to an end of the main portion. The head portion comprises nitrogen ions, oxygen ions, fluoride ions, or argon ions, and a width of the head portion is greater than a width of a center of the main portion. A method of forming the semiconductor device is also disclosed.

10 Claims, 7 Drawing Sheets

(51) Int. Cl.

| | |
|---|---|
| ***H10D 64/23*** | (2025.01) |
| ***H10D 64/27*** | (2025.01) |
| ***H10P 30/20*** | (2026.01) |

(56) References Cited

U.S. PATENT DOCUMENTS

| | | | | |
|---|---|---|---|---|
| 2021/0296452 | A1* | 9/2021 | Hanson ................ | H10D 30/015 |
| 2022/0367685 | A1 | 11/2022 | Wu et al. | |
| 2023/0178616 | A1 | 6/2023 | Zhang et al. | |
| 2023/0369480 | A1 | 11/2023 | Shih et al. | |
| 2024/0063303 | A1 | 2/2024 | Cheng | |

FOREIGN PATENT DOCUMENTS

| | | | |
|---|---|---|---|
| TW | 202347709 | A | 12/2023 |
| TW | 202412312 | A | 3/2024 |

* cited by examiner

SEMICONDUCTOR DEVICE AND METHOD OF FORMING THE SAME

RELATED APPLICATIONS

This application claims priority to Taiwanese Application Serial Number 113109988, filed Mar. 18, 2024, which is herein incorporated by reference.

BACKGROUND

Field of Invention

The present disclosure relates to a semiconductor device and method of forming the same.

Description of Related Art

Power semiconductor devices have been rapidly developed and are widely utilized in various fields such as wireless communications, electronic devices, electric vehicles, etc. However, the high power devices require high breakdown voltage, high electron mobility, great thermal stability, etc. Therefore, there is a need to provide an enhanced semiconductor device and method of forming the same.

SUMMARY

An aspect of the disclosure provides a semiconductor device including a channel layer disposed on a substrate, a barrier layer disposed on the channel layer, a gate structure disposed on the barrier layer, and a source electrode and a drain electrode disposed on the barrier layer and disposed at opposite sides of the gate structure. The gate structure includes a main portion and a head portion adjacent to an end of the main portion. The head portion comprises nitrogen ions, oxygen ions, fluoride ions, or argon ions, and a width of the head portion is greater than a width of a center of the main portion.

An aspect of the disclosure provides a semiconductor device including a channel layer disposed on a substrate, a barrier layer disposed on the channel layer, a gate structure disposed on the barrier layer, and a source electrode and a drain electrode disposed on the barrier layer and disposed at opposite sides of the gate structure. The gate structure includes a main portion and two head portions adjacent to opposite ends of the main portion. Each head portion includes nitrogen ions, oxygen ions, fluoride ions, or argon ions, and a width of the head portion is greater than a width of a center of the main portion. The gate structure, the source electrode, and the drain electrode are extended in a first direction, lengths of the head portions and the main portion are measured in the first direction, the widths of the head portions and the width of the center of the main portion are measured in a second direction, wherein the second direction is perpendicular to the first direction.

Another aspect of the disclosure provides a method of forming a semiconductor device. The method includes sequentially forming a channel layer and a barrier layer on a substrate; forming a gate structure on the barrier layer, the gate structure including a main portion and two head portions at opposite ends of the main portion, wherein a width of each of the head portions is greater than a width of a center of the main portion; forming a source electrode and a drain electrode on the barrier layer and at opposite sides of the gate structure; forming a patterned photoresist covering the main portion of the gate structure to define an active area, wherein the head portions of the gate structure are exposed by the patterned photoresist and are defined as an isolation area; and performing a plasma bombard process using the patterned photoresist as a mask, to inject ions into the isolation area thereby forming an isolation region in the barrier layer and the channel layer. Performing the plasma bombard process includes forming lattice defects in portions of the barrier layer and the channel layer at the isolation area.

DESCRIPTION OF THE EMBODIMENTS

Figure 1:
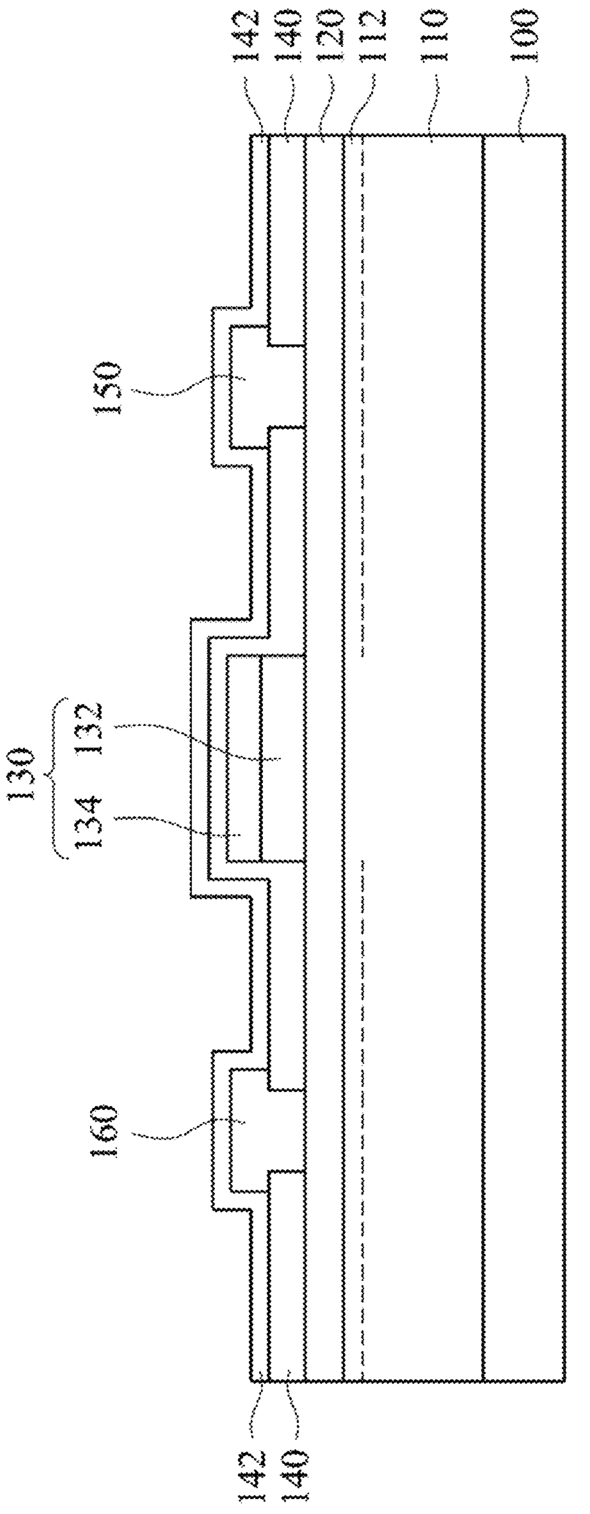
FIG. 1 is a cross-sectional view of a manufacturing stage of a method of forming a semiconductor device according to some embodiments of the disclosure.

Reference is made to FIG. 1, which is a cross-sectional view of a manufacturing stage of a method of forming a semiconductor device according to some embodiments of the disclosure. As shown in FIG. 1, the method of forming the semiconductor device includes forming a channel layer 110 on a substrate 100, and forming a barrier layer 120 on the channel layer 110. The substrate 100 can be a semiconductor substrate such as a Si substrate or a SiC substrate. The substrate 100 can include semiconductor components, compounds and/or alloy.

The channel layer 110 can provide a channel between source and drain. The barrier layer 120 is benefit to form a two-dimensional electron gas (2DEG) layer 112 within the channel layer 110, in which the 2DEG layer 112 has high concentration, high electron mobility, and lower resistance. In some embodiments, the material of the channel layer 110 includes epitaxial GaN. In some embodiments, the material of the barrier layer 120 includes AlGaN.

A gate structure 130 is formed on the barrier layer 120 to control the carrier passing or not of the channel layer 110. In some embodiments, the gate structure 130 includes a patterned doping layer 132 and a gate metal layer 134 on the doping layer 132. For example, the doping layer 132 can be GaN doped with P-type dopants. The material of the gate metal layer 134 can include suitable metal materials, such as TiN or the like.

Then, a first dielectric layer 140 is continuously and conformally extending on the barrier layer 120 and the gate structure 130. The first dielectric layer 140 is directly in contact with the barrier layer 120 and the gate structure 130. In some embodiments, the first dielectric layer 140 covers the barrier layer 120 and continuously covers the top surface and the side surface of the gate structure 130.

A drain electrode 150 and a source electrode 160 are formed at opposite sides of the gate structure 130. The material of the drain electrode 150 and the source electrode 160 is ohmic contact metal and is selected corresponded to the barrier layer 120. In some embodiments, the ohmic contact metal of the drain electrode 150 and the source electrode 160 may include Ti, Al, aluminum silicon alloy, AlCu alloy, TiN, Ni, Pt, Au, etc.

The second dielectric layer 142 is formed covering the drain electrode 150, the source electrode 160, and the first dielectric layer 140. In some embodiments, the material of the first dielectric layer 140 and the second dielectric layer 142 includes $SiO_2$, $Si_3N_4$, SiON, or the combinations thereof.

Figure 2:
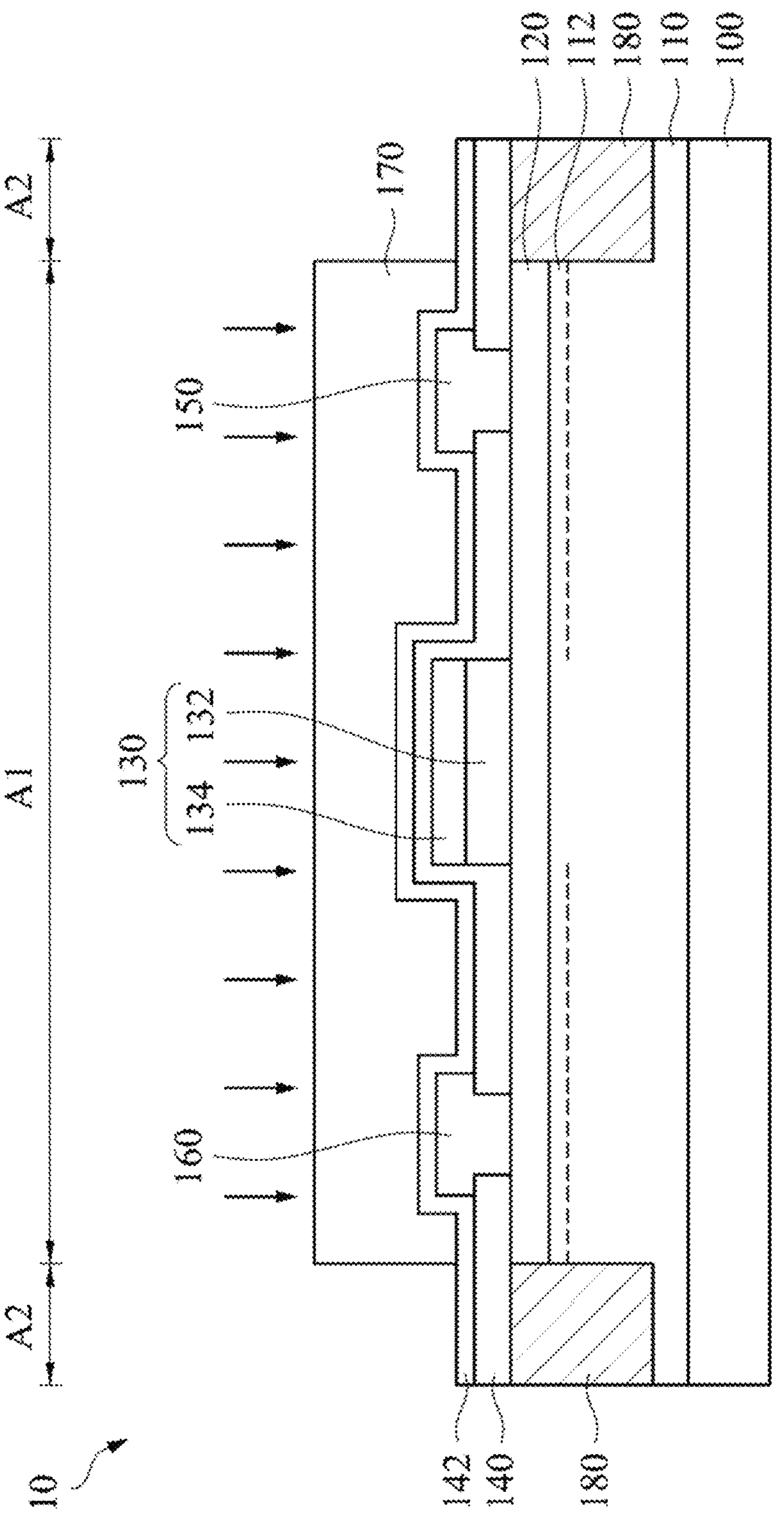
FIG. 2 is a cross-sectional view of another manufacturing stage of the method of forming the semiconductor device according to some embodiments of the disclosure.
Figure 3:
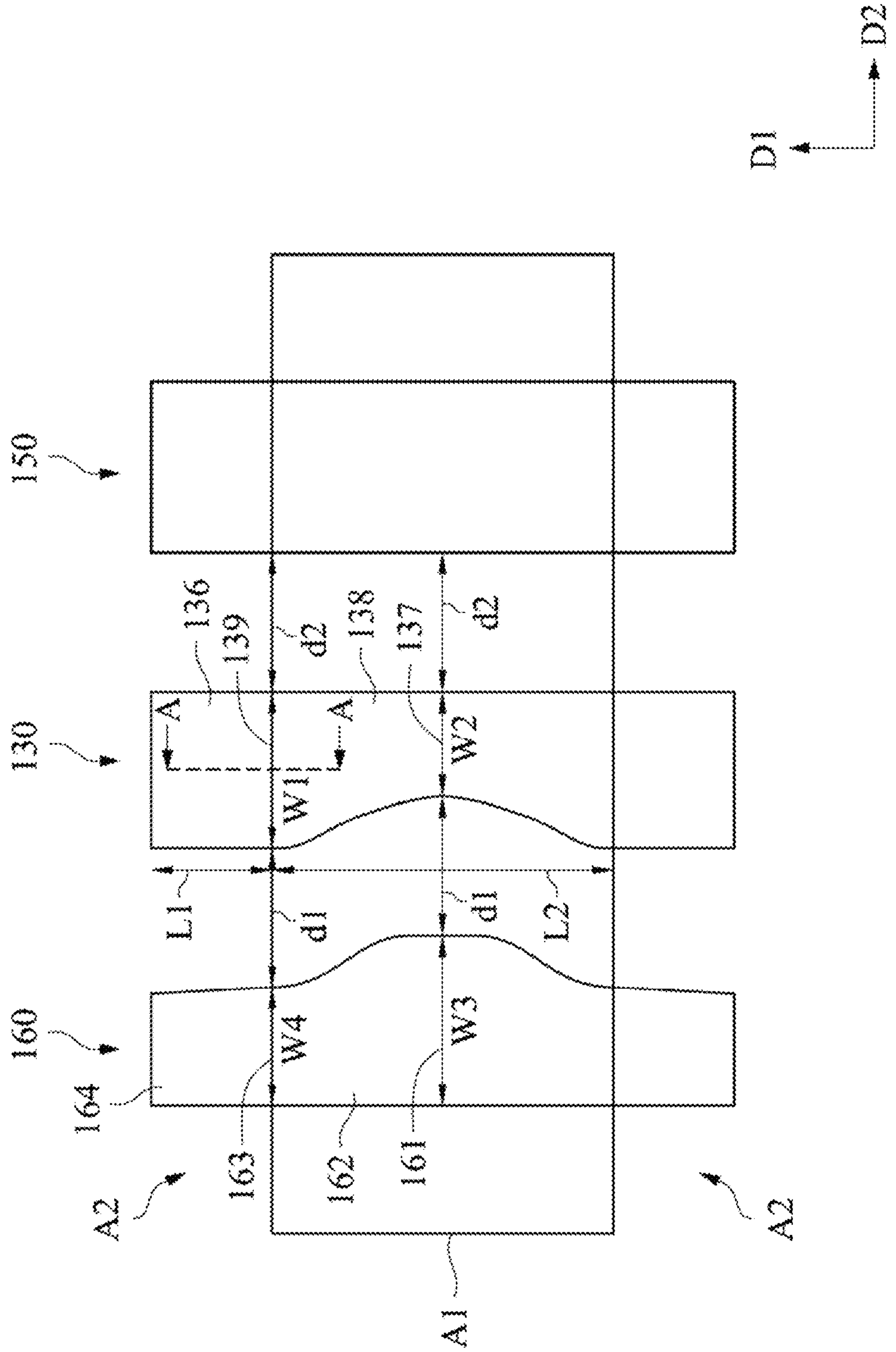
FIG. 3 is a top view of the semiconductor device of FIG. 2.

Reference is made to FIG. 2 and FIG. 3. FIG. 2 is a cross-sectional view of another manufacturing stage of the method of forming the semiconductor device according to some embodiments of the disclosure, and FIG. 3 is a top view of the semiconductor device of FIG. 2. As shown in FIG. 2 and FIG. 3, a patterned photoresist 170 is formed on the structure of FIG. 1 to define an active area A1 and an isolation area A2. The regions of the gate structure 130, the drain electrode 150, and the source electrode 160 covered by the patterned photoresist 170 are defined as the active area A1, and the regions of the gate structure 130, the drain electrode 150, and the source electrode 160 that are not covered by the patterned photoresist 170 are defined as the isolation area A2.

Then, a plasma bombard process is performed using the patterned photoresist 170 as a mask, to inject ions into the isolation area A2. The portions of barrier layer 120 and the underlying channel layer 110 at the isolation area A2 are damaged by the plasma bombard process, thereby damaging the 2DEG layer 112 at the isolation area A2. As a result, an isolation region 180 is formed in the barrier layer 120 and the channel layer 110. The region of the 2DEG layer 112 at the active area A1 is protected by the patterned photoresist 170 and is free from being damaged by the plasma bombard process. In some embodiments, the ions utilized in the plasma bombard process include nitrogen ions, oxygen ions, fluoride ions, or argon ions.

As shown in FIG. 3, the gate structure 130 includes two head portions 136 at the isolation area A2 and a main portion 138 at the active area A1, in which the head portions 136 are at opposite ends of the main portion 138, and the main portion 138 and the head portions 136 are defined by same materials and same processes.

The main portion 138 is covered by the patterned photoresist 170 during the plasma bombard process, and the head portions 136 are exposed from the patterned photoresist 170 during the plasma bombard process. The main portion 138 has ends 139 connecting the head portions 136. In some embodiments, the width W1 of the head portion 136 is greater than the width W2 of the center 137 of the main portion 138, to further improve the performance of the semiconductor device 10. Details thereof are discussed in FIG. 4.

Figure 4:
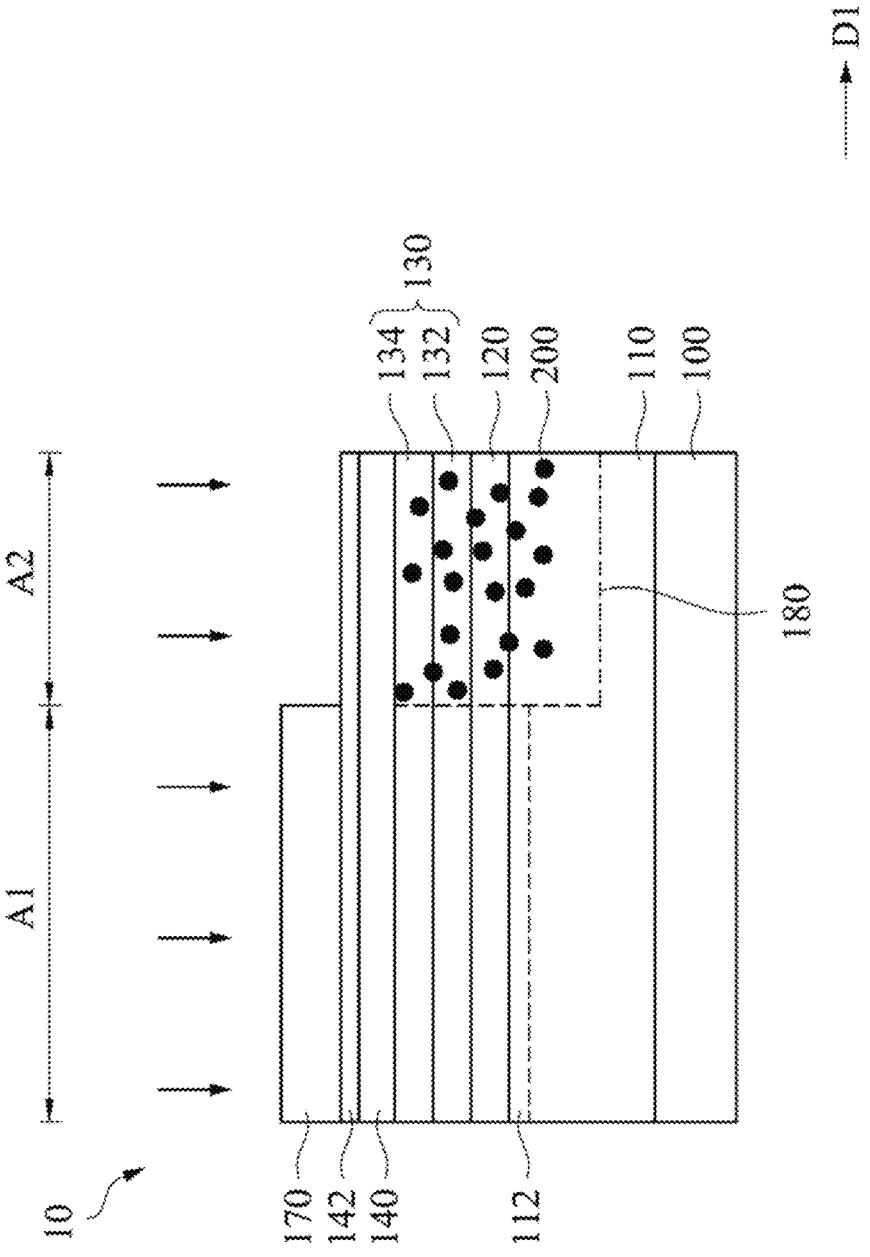
FIG. 4 is a cross-sectional view of the semiconductor device according to some embodiments of the disclosure.

Reference is made to FIG. 4, which is a cross-sectional view of the semiconductor device according to some embodiments of the disclosure, in which FIG. 4 is taken along line A-A of FIG. 3. Because the isolation region 180 of the semiconductor device 10 is formed by the plasma bombard process including injecting ions into the barrier layer 120 and the underlying channel layer 110, the defects 200 are unpreventably formed in the barrier layer 120 and the channel layer 110 at the isolation region 180. More particularly, the barrier layer 120 and the channel layer 110 are epitaxial layers, and the type of the defects 200 is a lattice defect. In some embodiments, the gate structure 130 includes the doping layer 132 and the gate metal layer 134, and the defects 200 are also present in the doping layer 132 and/or the gate metal layer 134.

When the semiconductor device 10 is electrical tested or operated, a voltage is applied to the gate structure 130 to decide whether the carrier passes through the channel layer 110 or not. During the period of applying the voltage to the gate structure 130, some positive charges would be trapped in the defects 200. Even the semiconductor device 10 is at an Off state, these trapped positive charges would not be removed and are remained in the isolation region 180 and the portion of the doping layer 132 of the gate structure 130 adjacent to the isolation region 180.

These remained positive charges would induce 2DEG layer 112 again at the nearby isolation region 180. These remained positive charges would also induce negative charges at the nearby channel layer 110 of the active area A1 thereby reducing threshold voltage (Vth). Both the situations increase the off-state leakage current (Ioff) of the semiconductor device 10.

The off-state leakage current is exponential disproportional to the gate width. Additionally, the influence area of the defects 200 is mainly at the interface between the active area A1 and the isolation area A2. Therefore, enlarging the width W1 of the head portions 136 of the gate structure 130 is benefit to reduce the off-state leakage current of the semiconductor device 10.

Reference is made back to FIG. 3. The gate structure 130, the drain electrode 150, and the source electrode 160 are extended in a first direction D1. The direction of the carrier path between the drain electrode 150 and the source electrode 160 is in the second direction D2, in which the second direction D2 is perpendicular to the first direction D1. The width W1 of the head portion 136 and the W2 of the center 137 of the main portion 138 are measured along the second direction D2.

In some embodiments, the width W1 of the head portion 136 is the maximum width of the head portion 136, and the W2 of the center 137 of the main portion 138 is the width of the main portion 138 at a half of the main portion 138 in the first direction D1.

In some embodiments, the width W1 of the head portion 136 is greater than 1 time of the W2 of the center 137 of the main portion 138. The greater width W1 of the head portion 136 is, the better efficiency of reducing off-state leakage current is improved. The head portion 136 has a length L1 in the first direction D1, and the main portion 138 has a length L2 in the first direction D1. In some embodiments, the length L1 of the head portion 136 is in a range from 1 μm to 20 μm, and the length L2 of the main portion 138 is in a range from 10 μm to 2000 μm. Please note that the lengths L1 and L2 can be varied according to the current density, and the ranges of the disclosure are not limit to.

In some embodiments, the gate structure 130 can be an asymmetric structure. As shown in FIG. 3, the head portions 136 of the gate structure 130 are extended towards the source electrode 160, the main portion 138 of the gate structure 130 has a decreasing width from the end 139 adjacent the head portion 136 to the center 137, and the sidewall of the gate structure 130 facing the drain electrode 150 is linear. Correspondingly, the main portion 162 (not being ions injected) of the source electrode 160 is extended towards the gate structure 130, and the width W3 of the center 161 of the main portion 162 of the source electrode 160 is greater than the width W4 of the head portion 164 of the source electrode 160.

In some embodiments, the distance between the gate structure 130 and the drain electrode 150 is constant, and the distance between the gate structure 130 and the source electrode 160 is constant. For example, a spacing d1 is between the end 139 of the main portion 138 of the gate structure 130 and the end 163 of the main portion 162 of the source electrode 160, and the center 137 of the main portion 138 of the gate structure 130 and the center 161 of the main portion 162 of the source electrode 160 also have the same spacing d1 therebetween. A spacing d2 is between the end 139 of the main portion 138 of the gate structure 130 and the drain electrode 150, and the center 137 of the main portion 138 of the gate structure 130 and the drain electrode 150 also have the same spacing d2 therebetween.

In some embodiments, the width W4 of the head portion 164 of the source electrode 160 and the width W1 of the head portion 136 of the gate structure 130 are present at the positions adjacent to the end 163 of the main portion 162 of the source electrode 160 and the end 139 of the main portion 138 of the gate structure 130. A sum of the width W4 of the head portion 164 of the source electrode 160, the width W1 of the head portion 136 of the gate structure 130, and the spacing d1 therebetween is equal to a sum of the width W3 of the center 161 of the main portion 162 of the source electrode 160, the width W2 of the center 137 of the main portion 138 of the gate structure 130, and the spacing d1 therebetween, e.g. (W4+d1+W1)=(W3+d1+W2).

Figure 5:
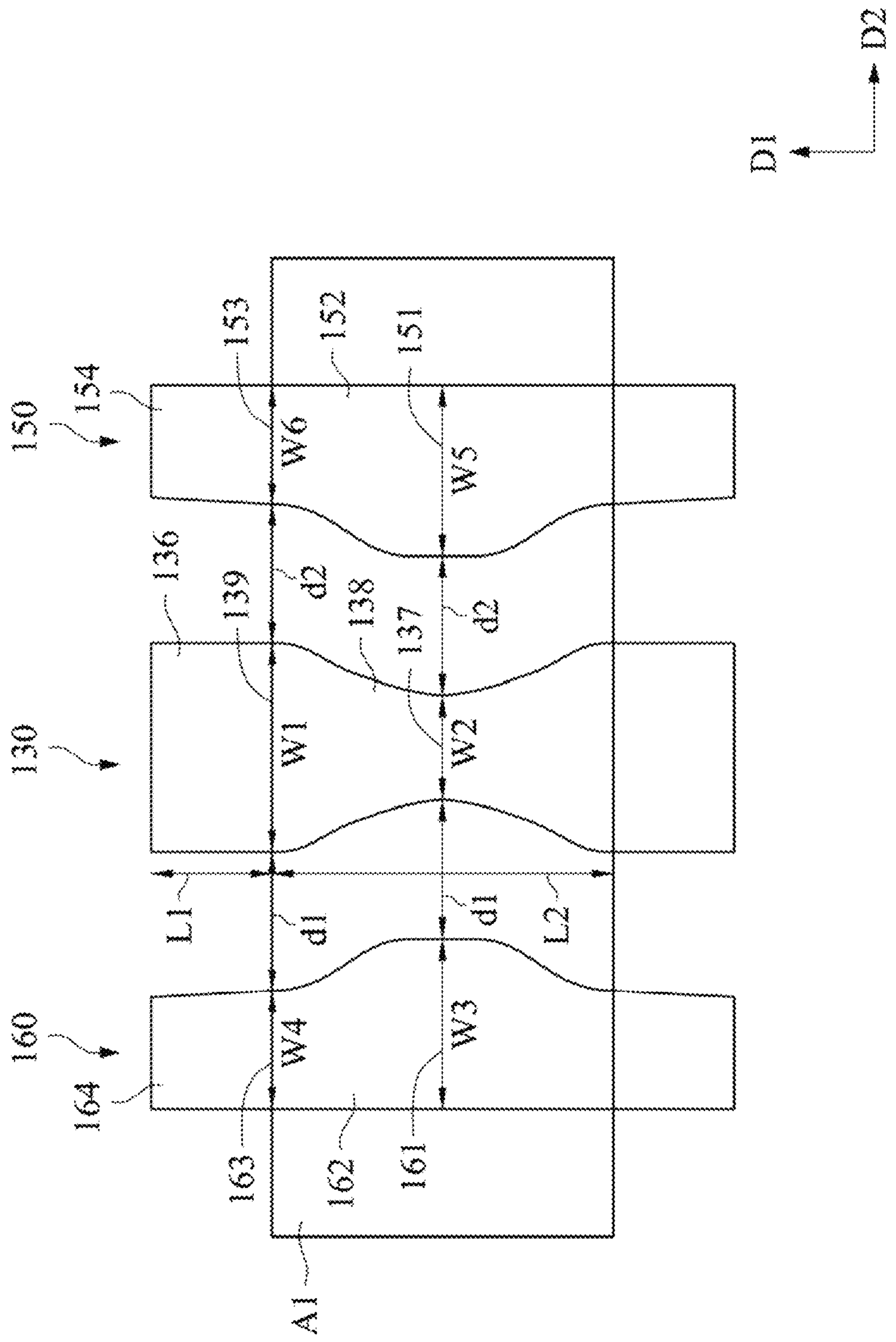
FIG. 5 and FIG. 6 are top views of the semiconductor device according to some other embodiments of the disclosure.

Reference is made to FIG. 5, which is a top view of the semiconductor device according to some other embodiments of the disclosure. In some embodiments, the gate structure 130 can be a symmetric structure. For example, the head portions 136 of the gate structure 130 are extended towards the drain electrode 150 and the source electrode 160. Correspondingly, the main portion 152 (not being ions injected) of the drain electrode 150 and the main portion 162 of the source electrode 160 are extended towards the gate structure 130.

The width W1 of the head portion 136 is greater than 1 time of the W2 of the center 137 of the main portion 138. The greater width W1 of the head portion 136 is, the better efficiency of reducing off-state leakage current is improved. In some embodiments, the head portion 136 has the length L1 in the first direction D1, and the main portion 138 has the length L2 in the first direction D1. In some embodiments, the length L1 of the head portion 136 is in a range from 1 μm to 20 μm, and the length L2 of the main portion 138 is in a range from 10 μm to 2000 μm. Please note that the lengths L1 and L2 can be varied according to the current density, and the ranges of the disclosure are not limit to.

In some embodiments, the width W5 of the center 151 of the main portion 152 of the drain electrode 150 is greater than the width W6 of the head portion 154 of the drain electrode 150. The width W3 of the center 161 of the main portion 162 of the source electrode 160 is greater than the width W4 of the head portion 164 of the source electrode 160.

In some embodiments, the distance between the gate structure 130 and the drain electrode 150 is constant, and the distance between the gate structure 130 and the source electrode 160 is constant. For example, a spacing d1 is between the end 139 of the main portion 138 of the gate structure 130 and the end 163 of the main portion 162 of the source electrode 160, and the center 137 of the main portion 138 of the gate structure 130 and the center 161 of the main portion 162 of the source electrode 160 also have the same spacing d1 therebetween. A spacing d2 is between the end 139 of the main portion 138 of the gate structure 130 and the end 153 of the main portion 152 of the drain electrode 150, and the center 137 of the main portion 138 of the gate structure 130 and the center 151 of the main portion 152 of the drain electrode 150 also have the same spacing d2 therebetween.

In some embodiments, the width W4 of the head portion 164 of the source electrode 160, the width W1 of the head portion 136 of the gate structure 130, and the width W6 of the head portion 154 of the drain electrode 150 are present at the positions adjacent to the end 163 of the main portion 162 of the source electrode 160, the end 139 of the main portion 138 of the gate structure 130, and the end 153 of the main portion 152 of the drain electrode 150. A sum of the width W4 of the head portion 164 of the source electrode 160, the width W1 of the head portion 136 of the gate structure 130, the width W6 of the head portion 154 of the drain electrode 150, and the spacing d1 and spacing d2 therebetween is equal to a sum of the width W3 of the center 161 of the main portion 162 of the source electrode 160, the width W2 of the center 137 of the main portion 138 of the gate structure 130, the width W5 of the center 151 of the main portion 152 of the drain electrode 150, and the spacing d1 and the spacing d2 therebetween, e.g. (W4+d1+W1+d2+W6)=(W3+d1+W2+d2+W5).

Figure 6:
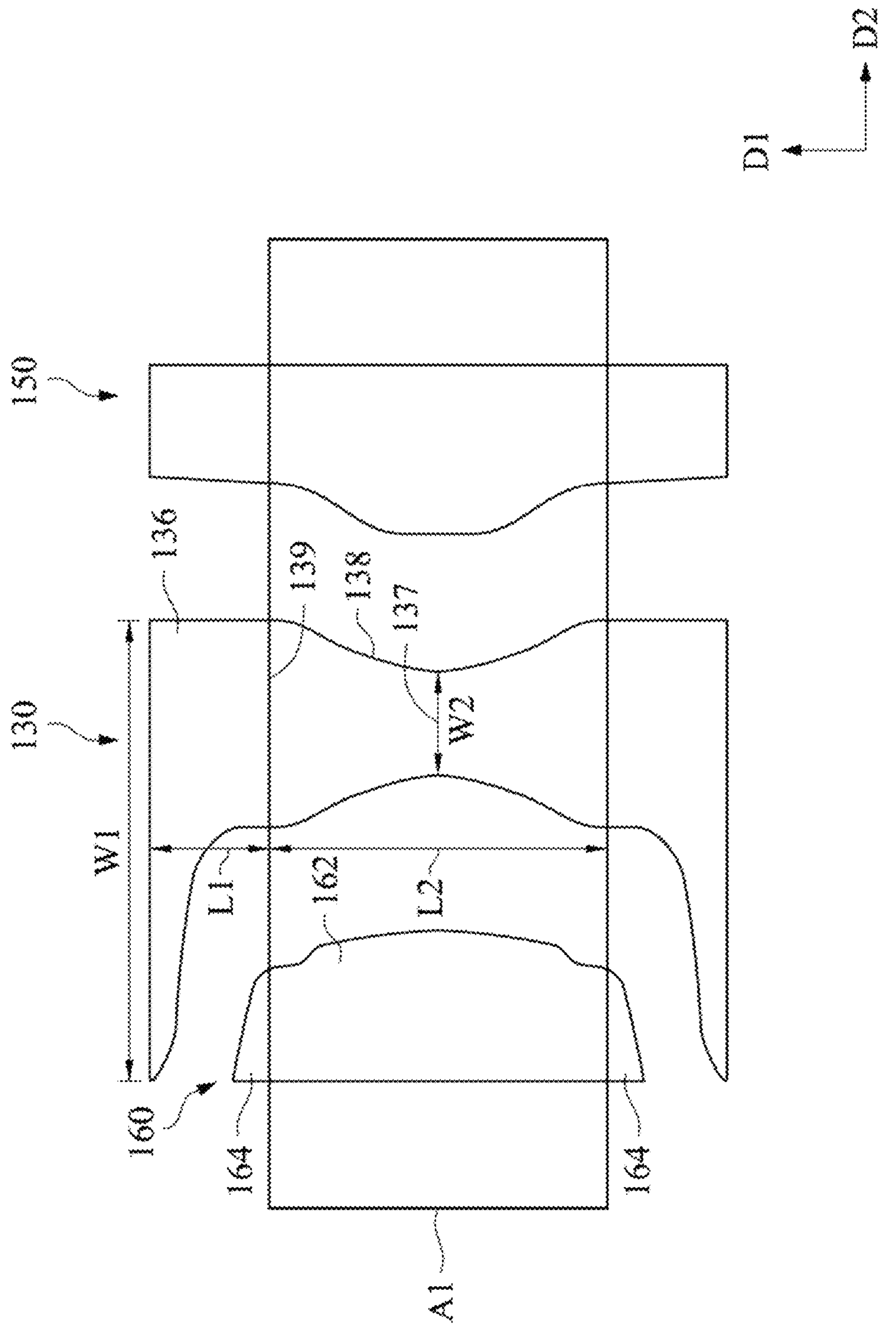

Reference is made to FIG. 6, which is a top view of the semiconductor device according to some other embodiments of the disclosure. In some embodiments, the head portions 136 of the gate structure 130 are extended towards the source electrode 160 such as the head portions 136 are extended above the source electrode 160. Namely, in the first direction D1, the head portions 136 of the gate structure 130 are located at opposite sides of the main portion 162 of the source electrode 160. The head portions 164 of the source electrode 160 have decreasing widths from the interfaces between the head portions 164 and the main portion 162.

In some embodiments, the width W1 of the head portion 136 is greater than 1 time of the W2 of the center 137 of the main portion 138. The greater width W1 of the head portion 136 is, the better efficiency of reducing off-state leakage current is improved. In some embodiments, the length L1 of the head portion 136 is in a range from 1 μm to 20 μm, and the length L2 of the main portion 138 is in a range from 10 μm to 2000 μm. Please note that the lengths L1 and L2 can be varied according to the current density, and the ranges of the disclosure are not limit to.

Figure 7:
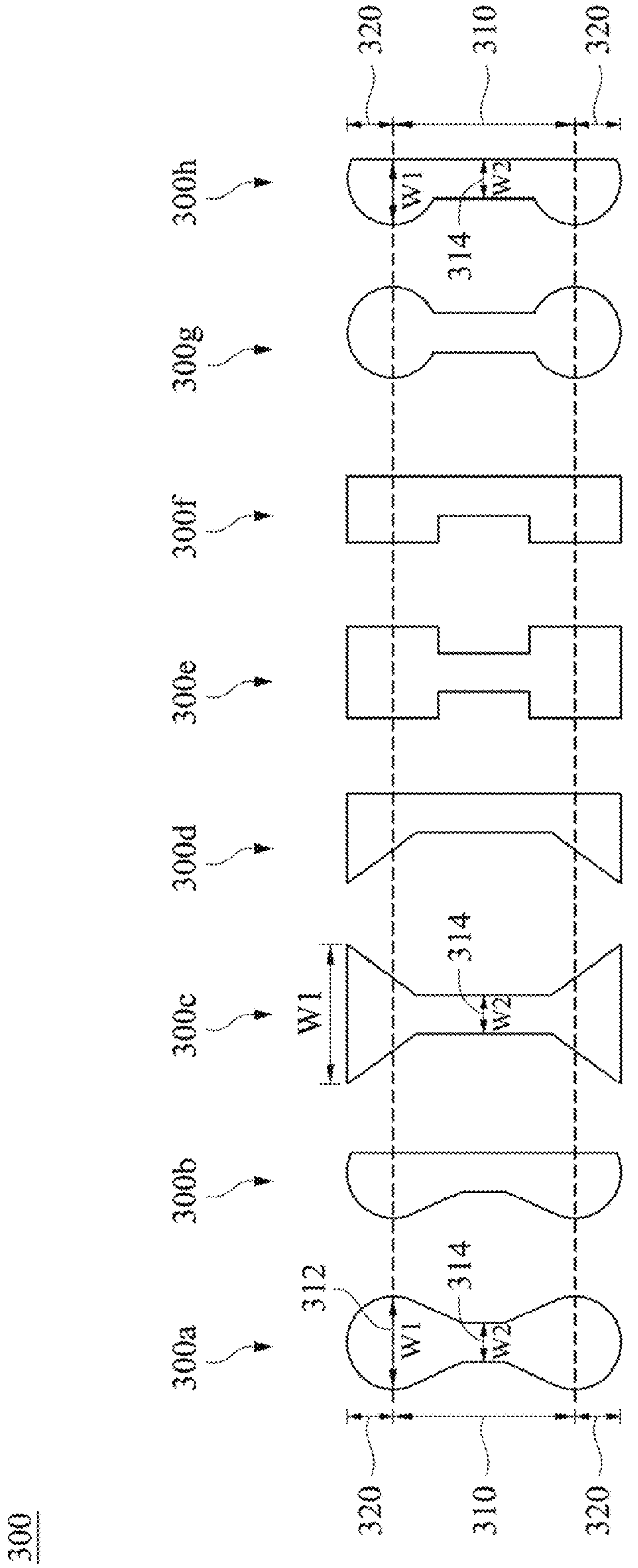
FIG. 7 is a top view of the semiconductor device according to different embodiments of the disclosure.

Reference is made to FIG. 7, which is a top view of the semiconductor device according to different embodiments of the disclosure. The gate structure 300 of the semiconductor device may have many variations such as the gate structures **300*a*-300*h* illustrated in FIG. 7. Each of the gate structures 300 includes the main portion 310 and the head portions 320 adjacent to opposite ends of the main portion 310, in which the head portions 320 of each of the gate structures 300 are processed by the plasma bombard process to inject ions within and are served as the isolation area, and the main portion 310 of each of the gate structures 300 is served as the active area. The width W1 of the head portion 320 of each of the gate structures 300 is greater than the width W2 of the main portion 310 of each of the gate structures 300**.

In some embodiments, the gate structures 300 can be a symmetric structure along a long axis such as the gate structures **300*a*, 300*c*, 300*e*, and 300*g*. In some embodiments, the gate structures 300 can be an asymmetric structure along a long axis such as the gate structures 300*b*, 300*d*, 300*f*, and 300*h***.

In some embodiments, the head portions 320 of the gate structures 300 can be a spindle-like shape such as the gate structures **300*a* and 300*b*. In some embodiments, the head portions 320 of the gate structures 300 can be a triangle-like shape such as the gate structures 300***c* and 300*d*. In some embodiments, the head portions 320 of the gate structures 300 can be a rectangle-like shape such as the gate structures 300*e* and 300*f*. In some embodiments, the head portions 320 of the gate structures 300 can be a circle-like shape such as the gate structures 300*g* and 300*h*.

According to some embodiments of the disclosure, the gate structure includes the main portion and the head portions adjacent to opposite ends of the main portion. The head portions of the gate structure are processed by the plasma bombard process to inject ions within and are served as the isolation area, and the main portion of the gate structure is served as the active area. The width of the head portion of the gate structure is greater than the width of the center of the main portion of the gate structure thereby reducing the off-state leakage current of the semiconductor device.

What is claimed is:

1. A semiconductor device comprising:
- a channel layer disposed on a substrate;
- a barrier layer disposed on the channel layer;
- a gate structure disposed on the barrier layer, the gate structure comprising a main portion and a head portion adjacent to an end of the main portion, wherein the head portion comprises nitrogen ions, oxygen ions, fluoride ions, or argon ions, wherein a width of the head portion of the gate structure is greater than a width of a center of the main portion of the gate structure; and
- a source electrode and a drain electrode disposed on the barrier layer and disposed at opposite sides of the gate structure, wherein a width of a head portion of the source electrode is smaller than a width of a center of a main portion of the source electrode, or a width of a head portion of the drain electrode is smaller than a width of a center of a main portion of the drain electrode.

2. The semiconductor device of claim 1, wherein the semiconductor device comprises:
- an active area comprising the main portion of the gate structure, wherein the active area is not processed by an plasma bombard process; and
- an isolation area comprising the head portion of the gate structure, wherein the isolation area is processed by an plasma bombard process.

3. The semiconductor device of claim 2, wherein portions of the barrier layer and the channel layer at the isolation area comprise lattice defects.

4. The semiconductor device of claim 1, wherein a sum of the width of the head portion of the source electrode, the width of the head portion of the gate structure, the width of the head portion of the drain electrode, and spacings therebetween is equal to a sum of the width of the center of the main portion of the source electrode, the width of the center of the main portion of the gate structure, the width of the center of the main portion of the drain electrode, and spacings therebetween.

5. A semiconductor device comprising:
- a channel layer disposed on a substrate;
- a barrier layer disposed on the channel layer;
- a gate structure disposed on the barrier layer, the gate structure comprising a main portion and two head portions adjacent to opposite ends of the main portion, wherein each of the head portions comprises nitrogen ions, oxygen ions, fluoride ions, or argon ions, wherein a width of each of the head portions of the gate structure is greater than a width of a center of the main portion of the gate structure; and
- a source electrode and a drain electrode disposed on the barrier layer and disposed at opposite sides of the gate structure, wherein the gate structure, the source electrode, and the drain electrode are extended in a first direction, lengths of the head portions and the main portion of the gate structure are measured in the first direction, the widths of the head portions and the width of the center of the main portion of the gate structure are measured in a second direction, wherein the second direction is perpendicular to the first direction, wherein a width of a head portion of the source electrode is smaller than a width of a center of a main portion of the source electrode, or a width of a head portion of the drain electrode is smaller than a width of a center of a main portion of the drain electrode.

6. The semiconductor device of claim 5, wherein the head portions of the gate structure are extended towards the source electrode.

7. The semiconductor device of claim 5, wherein the head portions of the gate structure are extended towards the drain electrode.

8. The semiconductor device of claim 5, wherein the head portions of the gate structure are extended towards the source electrode, and the head portions of the gate structure are located at opposite ends of a main portion of the source electrode, in the first direction.

9. A method of forming a semiconductor device comprising:
- sequentially forming a channel layer and a barrier layer on a substrate;
- forming a gate structure on the barrier layer, the gate structure comprising a main portion and two head portions at opposite ends of the main portion, wherein a width of each of the head portions is greater than a width of a center of the main portion;
- forming a source electrode and a drain electrode on the barrier layer and at opposite sides of the gate structure;
- forming a patterned photoresist covering the main portion of the gate structure to define an active area, wherein the head portions of the gate structure are exposed by the patterned photoresist and are defined as an isolation area; and
- performing a plasma bombard process using the patterned photoresist as a mask, to inject ions into the isolation area thereby forming an isolation region in the barrier layer and the channel layer, wherein performing the plasma bombard process comprises forming lattice defects in portions of the barrier layer and the channel layer at the isolation area.

10. The method of claim 9, further comprising performing an electrical test, wherein positive charges are trapped in the lattice defects.

* * * * *